(12) United States Patent
Hirata

(10) Patent No.: US 8,248,582 B2
(45) Date of Patent: Aug. 21, 2012

(54) STAGE APPARATUS, EXPOSURE APPARATUS, AND METHOD OF MANUFACTURING DEVICE

(75) Inventor: Yoshihiro Hirata, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 337 days.

(21) Appl. No.: 12/565,164

(22) Filed: Sep. 23, 2009

(65) Prior Publication Data

US 2010/0073662 A1   Mar. 25, 2010

(30) Foreign Application Priority Data

Sep. 25, 2008 (JP) ................................. 2008-246589

(51) Int. Cl.
*G03B 27/58* (2006.01)
*G03B 27/42* (2006.01)

(52) U.S. Cl. .......................................... 355/72; 355/53
(58) Field of Classification Search .................... 355/53, 355/72–76; 356/500
See application file for complete search history.

(56) References Cited

U.S. PATENT DOCUMENTS 6,785,005 B2 * 8/2004 Inoue .............................. 356/500
7,872,730 B2 * 1/2011 Kiuchi ............................. 355/53

FOREIGN PATENT DOCUMENTS

JP         2006-287122 A      10/2006

* cited by examiner

*Primary Examiner* — Hung Henry Nguyen
(74) *Attorney, Agent, or Firm* — Canon U.S.A., Inc. IP Division

(57) ABSTRACT

A stage apparatus includes plural stages movable across plural areas, movable bodies which are provided in one-to-one correspondence with the plural stages and are movable across the plural areas, plural lines which connect each of the plural stages to a corresponding one of the plural movable bodies, a driving unit which drives the plural movable bodies, and a controller which controls the driving by the driving unit. The controller controls the driving unit with the movable body moving in synch with movement of the stage during inter-area movement in which the stage moves across two of the plural areas, and stops the driving of the movable body by the driving unit or controls the driving unit with the movable body remaining at a specific target position during intra-area movement in which a process is performed on the stage while the stage moves within one of the plural areas.

6 Claims, 6 Drawing Sheets

STAGE APPARATUS, EXPOSURE APPARATUS, AND METHOD OF MANUFACTURING DEVICE

BACKGROUND OF THE INVENTION

1. Field of the Invention

The present invention relates to a stage apparatus, an exposure apparatus, and a method of manufacturing a device.

2. Description of the Related Art

In recent years, to improve the productivity of a semiconductor manufacturing apparatus, an exposure apparatus which includes two substrate stages and performs a process for exposing a substrate and a process for aligning a substrate in parallel is available. Such an exposure apparatus using two substrate stages can improve its overall processing speed as compared with a conventional scheme of performing a process for exposing a substrate and a process for aligning a substrate in series.

FIG. 7 is a plan view showing a stage apparatus 100' including two substrate stages 20' and 30'. In an exposure station shown on the left side of FIG. 7, a projection optical system (not shown) performs a substrate exposure process. Also, in an alignment station shown on the right side of FIG. 7, an alignment optical system (not shown) performs a substrate alignment process. The stage apparatus 100' shown in FIG. 7 performs an exposure process on the substrate stage 20' and an alignment process on the substrate stage 30' in parallel. After both of these processes are completed, the substrate stages 20' and 30' are swapped. The substrate stage 30' having undergone a substrate alignment process moves to the exposure station, and undergoes a substrate exposure process in the exposure station. The substrate stage 20' having undergone a substrate exposure process moves to the alignment station. In the alignment station, a substrate transport system (not shown) recovers the processed substrate from and provides a new substrate onto the substrate stage 20', and the substrate stage 20' undergoes an alignment process of the newly provided substrate. A substrate exposure process is continuously performed by repeating this sequence.

The stage apparatus 100' includes movable bodies 22' and 32' provided in one-to-one correspondence with the two substrate stages 20' and 30'. The movable bodies 22' and 32' respectively hold and relay pipe lines 21' and 31' which supply fluids such as coolants and gases for static pressure bearings to the substrate stages 20' and 30', or wiring lines 21' and 31' which supply, for example, currents such as electrical signals and powers to the substrate stages 20' and 30'. If the movable bodies 22' and 32' are immovably fixed in position, the pipe or wiring lines 21' and 31' need to have lengths long enough to allow the substrate stages 20' and 30' to be driven over driving ranges necessary in exposure and alignment. In this case, depending on the positional relationship between the substrate stages 20' and 30', the lines 21' and 31' may interfere with their unconnected substrate stages 20' and 30' or other constituent members of the stage apparatus 100' inside/outside the substrate stages 20' and 30'. In addition, the lines 21' and 31' must be as short as possible in order to suppress any vibration and reaction forces.

To surmount these difficulties, Japanese Patent Laid-Open No. 2006-287122 describes a technique of providing the stage apparatus 100' with a driving mechanism which drives the movable bodies 22' and 32', and moving the movable bodies 22' and 32' in synch with the substrate stages 20' and 30' during an alignment process and exposure process. Japanese Patent Laid-Open No. 2006-287122 detects the relative position between the movable body and the substrate stage, and controls driving of the movable body so that the detected relative position stays constant.

However, an alignment process and an exposure process generally require driving the substrate stage with high accuracy on the order of nanometers and high speed under high-response control. For this reason, to drive the movable body in synch with the substrate stage, they need to be controlled in synch with each other in real time with high accuracy on the order of nanometers and high speed, leading to complication of the control. The movable body also requires a driving mechanism and control mechanism which can attain a speed and accuracy as high as those for driving the substrate stage, resulting in increased cost. As the control response in driving the movable body increases, vibration of the movable body, in turn, increases. This may cause disturbances to the substrate stage through objects, which are prone to transmit vibration, such as the pipe and wiring lines and the floor.

SUMMARY OF THE INVENTION

The present invention provides a stage apparatus comprising a plurality of stages movable across a plurality of areas, a plurality of movable bodies which are provided in one-to-one correspondence with the plurality of stages and are movable across the plurality of areas, a plurality of lines which connect each of the plurality of stages to a corresponding one of the plurality of movable bodies, a driving unit which drives the plurality of movable bodies, and a controller which controls the driving by the driving unit, wherein the controller controls the driving unit with the movable body moving in synch with movement of the stage during inter-area movement in which the stage moves across two of the plurality of areas, and stops the driving of the movable body by the driving unit or controls the driving unit with the movable body remaining at a specific target position during intra-area movement in which a process is performed on the stage while the stage moves within one of the plurality of areas.

According to the present invention, it is possible to decrease drawbacks encountered when connecting lines to a plurality of movable stages of a stage apparatus.

Further features of the present invention will become apparent from the following description of exemplary embodiments with reference to the attached drawings.

DESCRIPTION OF THE EMBODIMENTS

Figure 1:
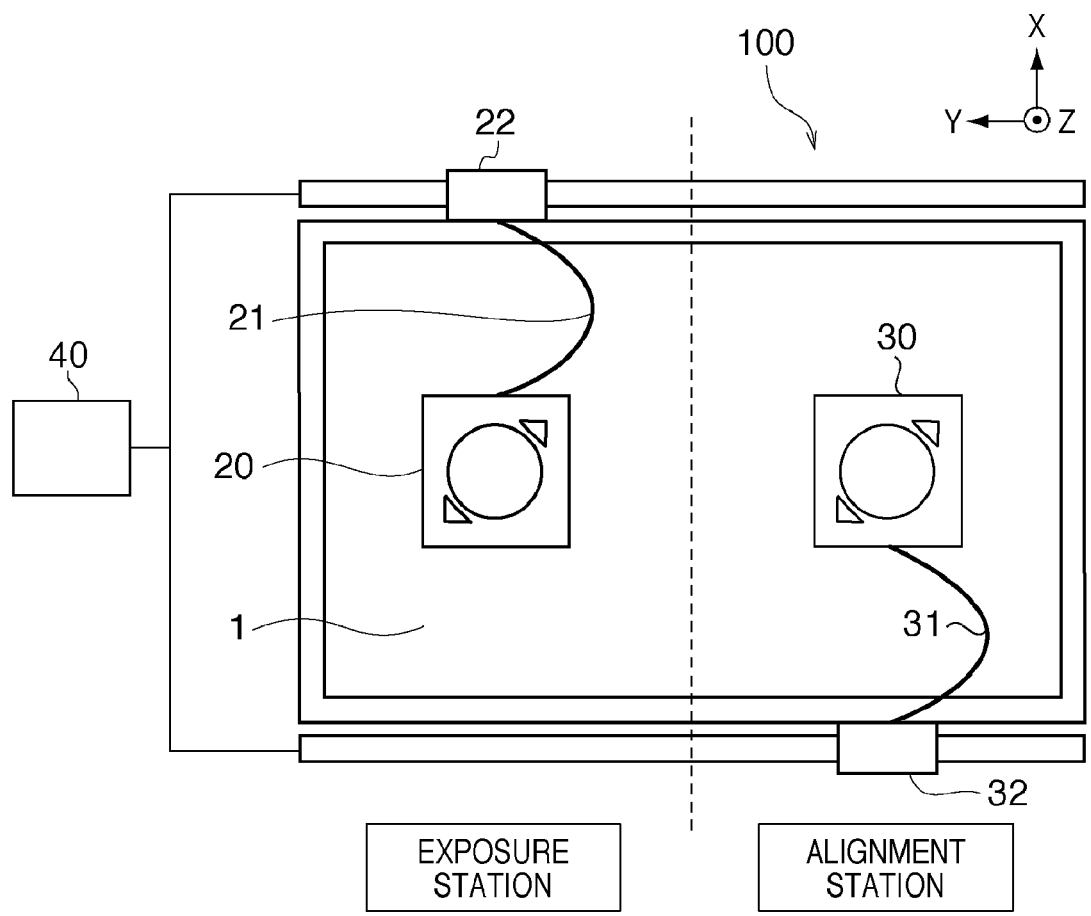
FIG. 1 is a plan view showing the schematic arrangement of a stage apparatus according to the first embodiment.
Figure 2:
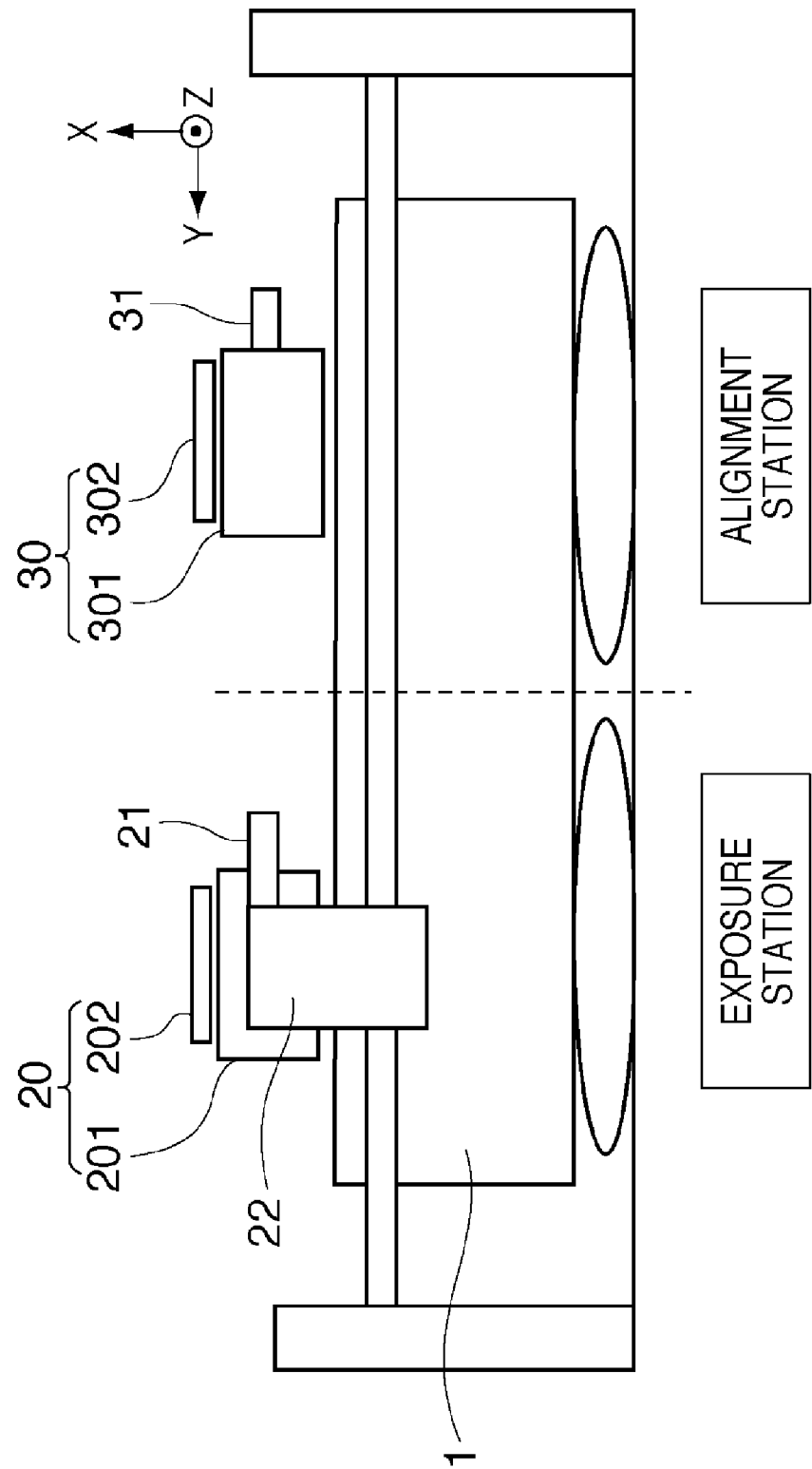
FIG. 2 is a side view showing the schematic arrangement of the stage apparatus according to the first embodiment.

FIGS. 1 and 2 are a plan view and a side view, respectively, showing the schematic arrangement of a stage apparatus in an exposure apparatus according to the first embodiment of the present invention. A stage apparatus 100 includes a plurality of stages 20 and 30 set on a surface plate 1, and movable bodies 22 and 32 provided in one-to-one correspondence with the plurality of stages 20 and 30. The plurality of stages 20 and 30 and the plurality of movable bodies 22 and 32 are movable across a plurality of areas. In this embodiment, the stage apparatus is provided with two stages and two movable bodies. Also in this embodiment, the stages 20 and 30 are stages which hold substrates, and the plurality of areas can include an alignment station serving as a first area for substrate alignment, and an exposure station serving as a second area for substrate exposure. Lines 21 and 31 connect the substrate stages 20 and 30 to the movable bodies 22 and 32, respectively. The lines 21 and 31 can be flexible members and serve as, for example, signal lines, power lines, decompression lines, pressured air lines, or coolant lines for adjusting the temperatures of heat sources of the substrate stages 20 and 30. The movable bodies 22 and 32 respectively hold and relay the lines 21 and 31 connected to the substrate stages 20 and 30.

The substrate stages 20 and 30 typically levitate above the surface plate 1 via air bearings. Each of the substrate stages 20 and 30 typically mounts a chucking device, which holds a substrate such as a wafer. The substrate stages 20 and 30 can be driven by plane motors of, for example, the plane pulse motor driving scheme or the plane Lorenz motor driving scheme. The substrate stages 20 and 30 can freely and independently move in at least two directions: the X and Y directions.

The stage apparatus 100 includes a sensor which detects the positions of the movable bodies 22 and 32, an actuator serving as a driving unit which drives the movable bodies 22 and 32 in at least one direction, and a controller 40 which controls driving of the movable bodies 22 and 32 by the actuator. The controller 40 feedback-controls the driving by the actuator, as will be described later.

A twin-stage type exposure apparatus including the two substrate stages 20 and 30 performs a process for exposing a substrate (exposure process) and a process for aligning a substrate (alignment process) in parallel.

In the exposure station shown on the left side of FIG. 1, a projection optical system (not shown) performs an exposure process of the substrate held by one substrate stage 20. Also, in the alignment station shown on the right side of FIG. 1, an alignment optical system (not shown) performs an alignment process of the substrate held by the other substrate stage 30.

Figure 3:
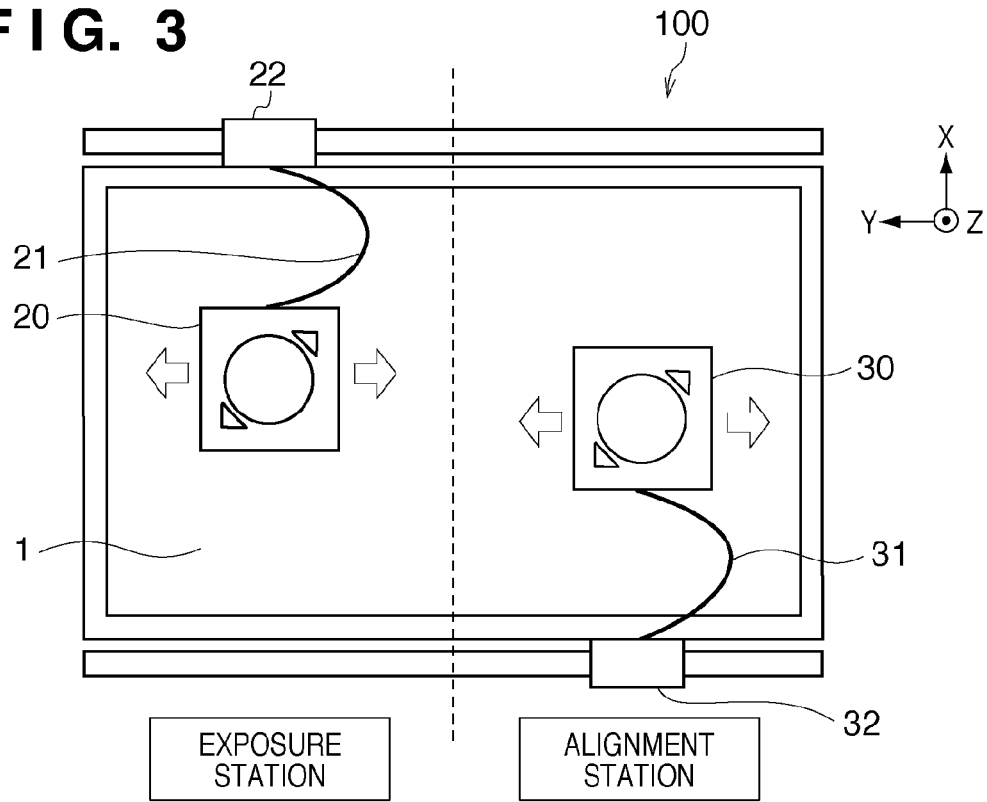
FIG. 3 is a view showing the states of stages and movable bodies during intra-area movement.

In an exposure process, the substrate stage 20 typically need only be driven within an area in the exposure station, which is necessary for substrate measurement and substrate exposure. Also, in an alignment process performed in parallel with the exposure process, the substrate stage 30 typically need only be driven within an area in the alignment station, which is necessary for substrate alignment. The lines 21 and 31 have lengths long enough to allow the movable bodies 22 and 32, which relay the lines 21 and 31, to smoothly move over the movable ranges of the substrate stages 20 and 30 when the movable bodies 22 and 32 lie at predetermined positions (the positions illustrated in FIG. 1) in the same areas as those where the substrate stages 20 and 30 lie. During intra-area movement in which an exposure or alignment process is performed on the substrate stage 20 or 30 while each of the substrate stages 20 and 30 moves within one area in each station, the movable bodies 22 and 32 do not move, as shown in FIG. 3.

The substrate stages 20 and 30 can include fine moving stages 202 and 302 which mount chucks and substrates and are driven with a small stroke, and coarse moving stages 201 and 301 which support the fine moving stages 202 and 302 in a non-contact manner and are driven with a large stroke. The coarse moving stages 201 and 301 driven with a large stroke have a driving capacity high enough to make them less susceptible to disturbances attributed to the reaction forces of the lines 21 and 31. Also, because the fine moving stages 202 and 302 driven with a small stroke are supported in a non-contact manner, disturbances from the lines 21 and 31 are less likely to be transmitted to the fine moving stages 202 and 302.

After the exposure process and alignment process performed in parallel are completed, the substrate stages 20 and 30 move across the areas in the exposure station and alignment station. Movement of the substrate stages across these two areas will be referred to as inter-area movement (or swapping) hereinafter.

In inter-area movement of the substrate stages 20 and 30, they need to move over ranges wider than those in intra-area movement for an exposure process and alignment process. This is to prevent the two substrate stages 20 and 30 from interfering with each other. To meet this requirement, the movable bodies 22 and 32 move in synch with movement of the substrate stages 20 and 30 and are swapped simultaneously with swapping of the substrate stages 20 and 30, as shown in FIG. 4.

Figure 4:
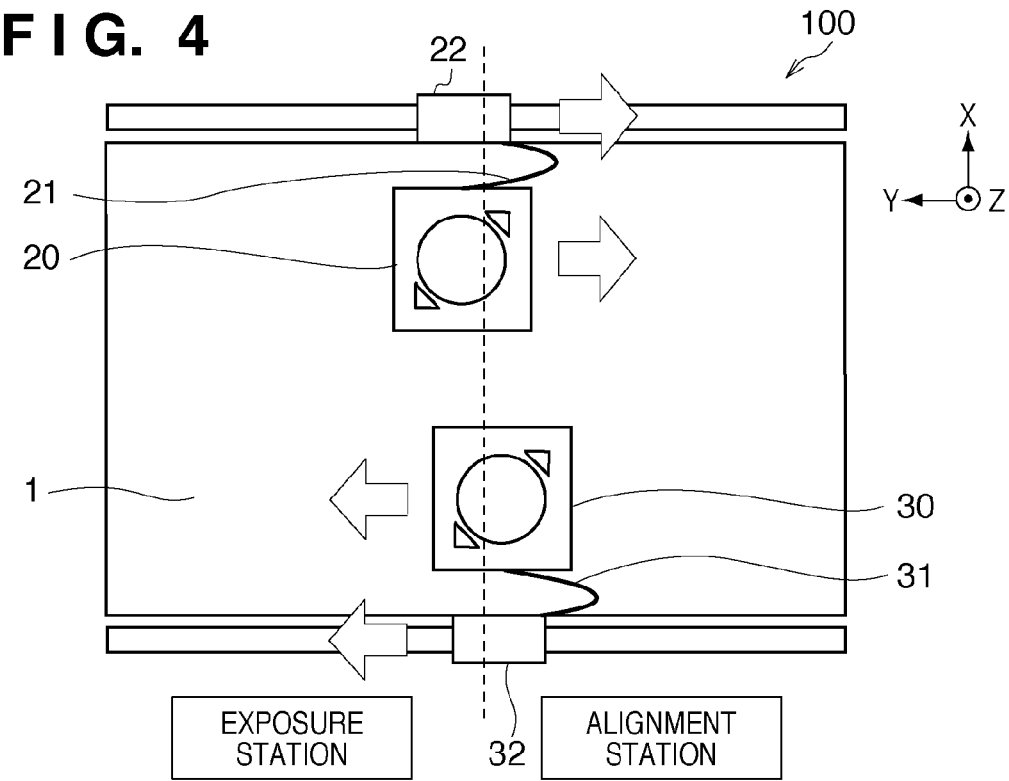
FIG. 4 is a view showing the states of the stages and movable bodies during inter-area movement.
Figure 5:
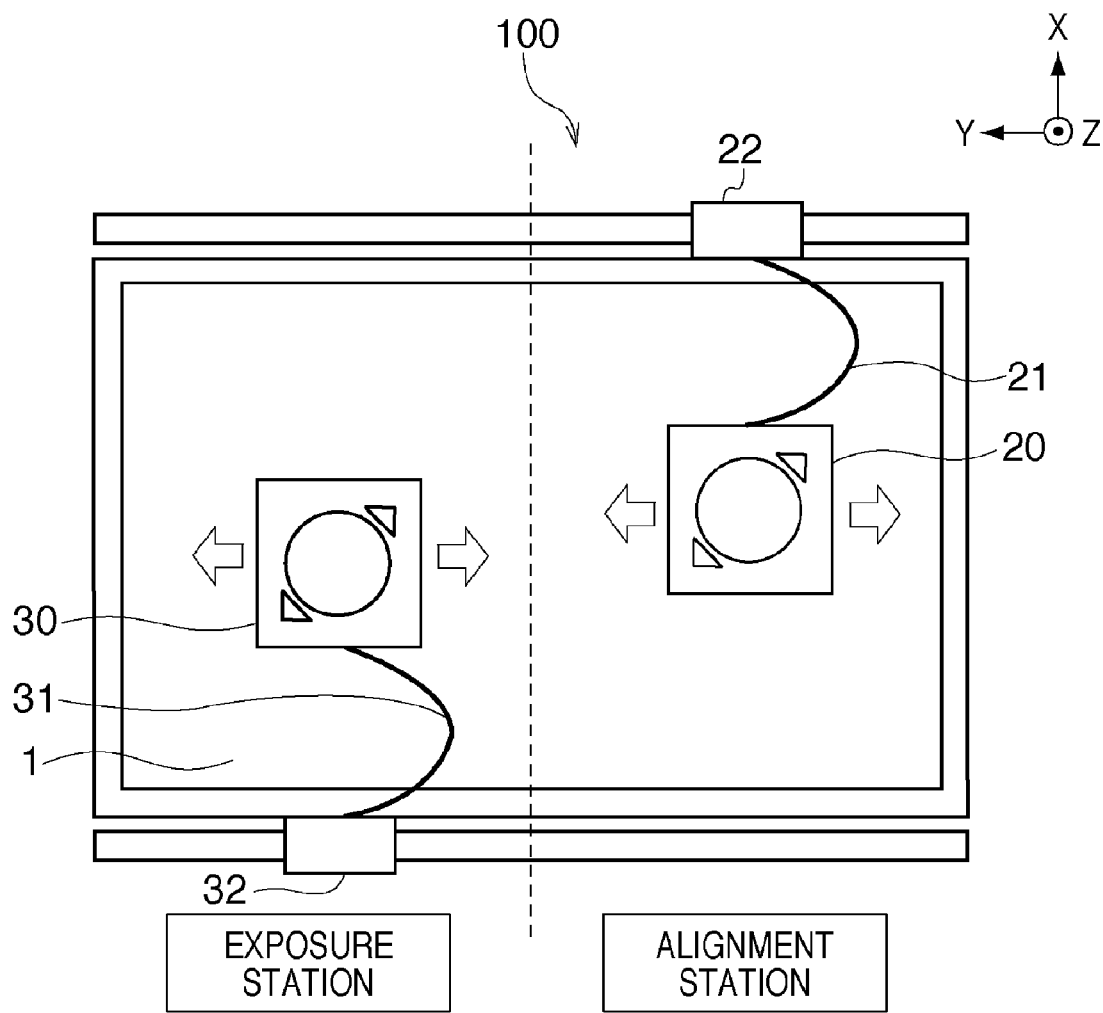
FIG. 5 is a view showing the states of the stages and movable bodies during intra-area movement after inter-area movement.

With this operation, the substrate stage 30 having undergone a substrate alignment process moves from the area in the alignment station into that in the exposure station (FIG. 4). Then, the substrate held on the substrate stage 30 is exposed within the area in the exposure station (FIG. 5). Likewise, the substrate stage 20 having undergone a substrate exposure process moves from the area in the exposure station into that in the alignment station (FIG. 4). After the substrate stage 20 has moved into the area in the alignment station, a substrate transport system (not shown) recovers the processed substrate from and provides a new substrate onto the substrate stage 20. The provided substrate undergoes an alignment process (FIG. 5).

A substrate exposure process can be continuously performed by repeating this sequence.

As described above, during inter-area movement which comparatively does not require high accuracy, the movable bodies 22 and 32 move in synch with movement of the substrate stages 20 and 30. Then, during an exposure process or alignment process with intra-area movement, the movable bodies 22 and 32 do not move without moving in synch with the substrate stages 20 and 30.

The state in which "the movable body does not move" means herein both the state in which the movable body completely stands still and that in which the movable body moves by a small amount. To stop the movable bodies 22 and 32 from moving, driving of the movable bodies 22 and 32 by the driving unit may be stopped or may be feedback-controlled so that the movable bodies 22 and 32 stay at specific target positions.

In the second embodiment of the present invention, a driving unit is controlled so that movable bodies 22 and 32 stay at specific target positions during intra-area movement as in the first embodiment. The control response of a controller 40 in controlling the driving unit is set lower than that in controlling driving of substrate stages 20 and 30. More specifically, "setting the control response low" amounts to setting the gain-crossover frequency [Hz] (the frequency at which the gain curve in the Bode diagram falls below zero decibel [dB]) low. To perform this operation, the gain-crossover frequency can be changed by adjusting a gain using a PID controller.

As a consequence, it is possible to reduce vibration generated by the movable bodies 22 and 32. This, in turn, makes it possible to inhibit any disturbances attributed to the movable bodies 22 and 32 from being transmitted to the substrate stages 20 and 30 through, for example, the floor and lines 21 and 31.

In the third embodiment, in addition to the use of the arrangement according to the second embodiment, the control response of a controller 40 in controlling a driving unit during intra-area movement is set lower than that during inter-area movement. If minor disturbances are not problematic as in the case of inter-area movement of substrate stages 20 and 30, the control response of the controller 40 in controlling the driving unit is increased to synchronize movement of movable bodies 22 and 32 with that of the substrate stages 20 and 30. Both the substrate stages 20 and 30 and the movable bodies 22 and 32 are driven with high thrusts by moving them in synch with each other. In this case, the foregoing effect can be obtained without lowering the throughput.

When the movable bodies 22 and 32 move in synch with the substrate stages 20 and 30, a compensator including an integrator may control driving of the movable bodies 22 and 32 using the driving unit. Then, when the movable bodies 22 and 32 stay at specific target positions and roughly stand still, driving of the movable bodies 22 and 32 may be controlled by a compensator including no integrator or that including an integrator having a sufficiently small limit.

Figure 6:
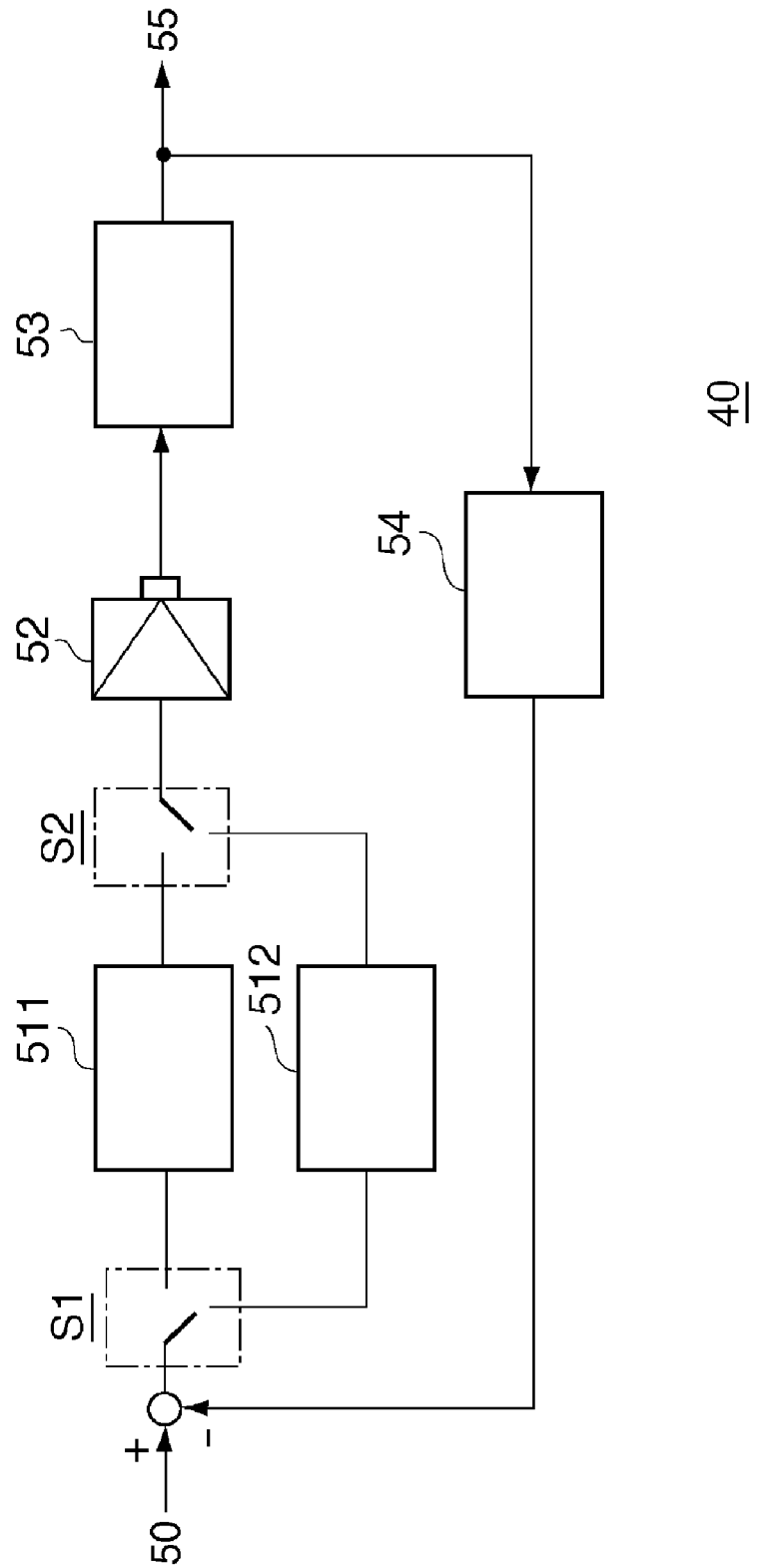
FIG. 6 is a block diagram illustrating an example of driving control of the movable bodies.
Figure 7:
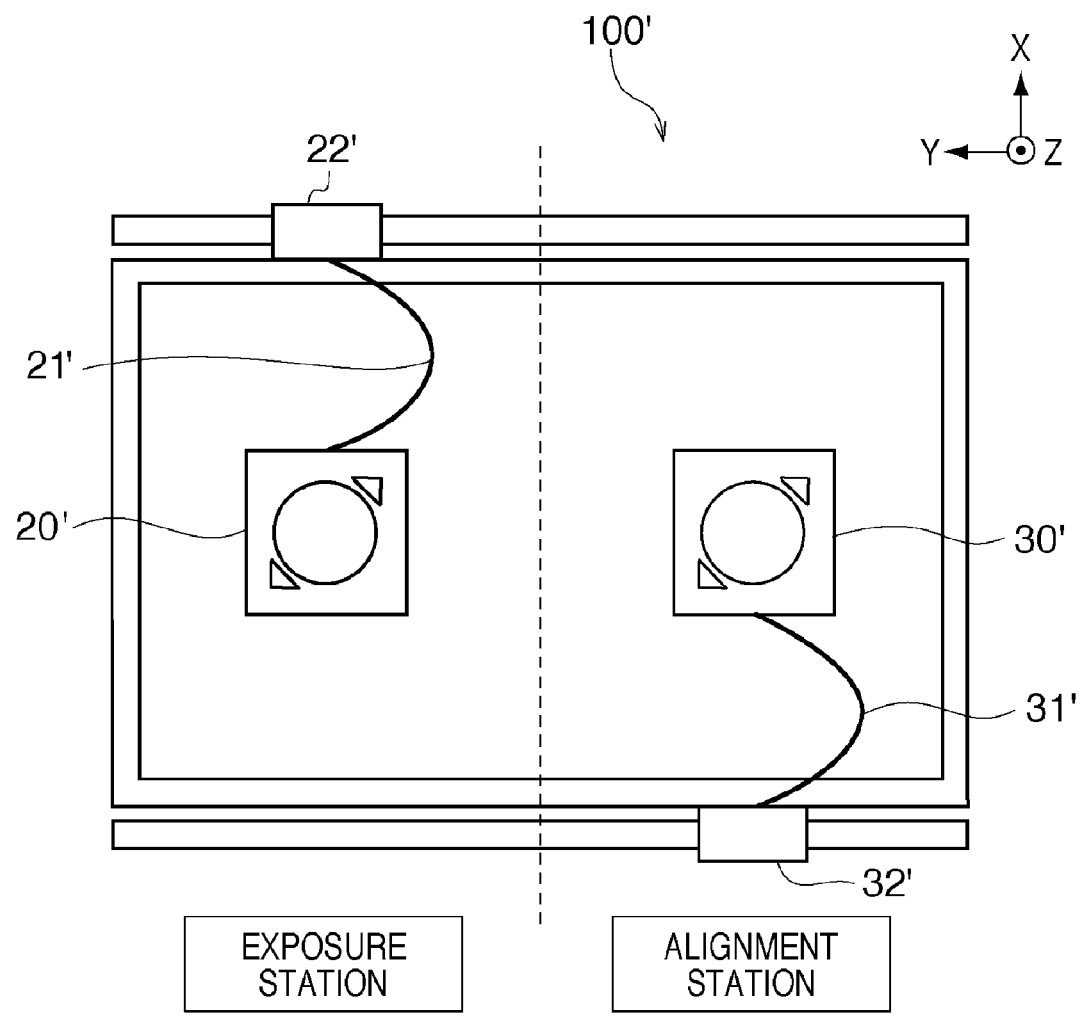
FIG. 7 is a plan view showing a twin-stage type stage apparatus according to a prior art.

FIG. 6 is a block diagram illustrating an example of control by the controller 40 shown in FIG. 1. The controller 40 includes a switch S1. The switch S1 is selectively connected to a control unit 511 or 512 so that the difference between a target value 50 and an output 55 from a sensor 54 is input to the control unit 511 or 512. The control unit 511 is a control unit including no integrator, whereas the control unit 512 is a control unit including an integrator. The control unit 511 is used to allow the movable bodies 22 and 32 to roughly stand still, whereas the control unit 512 is used to allow the movable bodies 22 and 32 to move in synch with the substrate stages 20 and 30. The outputs from the control units 511 and 512 are input to an actuator 53 serving as a driving unit via a driver 52.

According to the above-described first to third embodiments, there is no need to always synchronize the movable bodies 22 and 32 with the substrate stages 20 and 30 with high accuracy, thus simplifying driving control of the movable bodies 22 and 32. Moreover, driving control of the movable bodies 22 and 32 does not require a driving unit and controller equivalent in speed and accuracy to those of the substrate stages 20 and 30. This makes it possible to control driving of the movable bodies 22 and 32 using an arrangement assembled by low-spec, inexpensive components as compared with the substrate stages 20 and 30, thus cutting the cost. It is also possible to reduce vibration of the movable bodies 22 and 32, and this, in turn, makes it possible to inhibit any disturbances from being transmitted to the substrate stages 20 and 30 through, for example, the floor and the movable bodies 22 and 32.

Although a stage apparatus for an exposure apparatus has been exemplified in the first to third embodiments, the stage apparatus according to the present invention is also applicable to, for example, a support base which supports a work on a machine tool.

An embodiment of a method of manufacturing a device using the above-mentioned exposure apparatus will be explained next. The device is manufactured by a step of exposing a substrate coated with a photosensitive agent using the exposure apparatus according to each of the above-mentioned first to third embodiments, a step of developing the substrate exposed in the exposing step, and other known steps. The device can be, for example, a semiconductor integrated circuit device or a liquid crystal display device. The substrate can be, for example, a wafer or a glass plate. The other known steps include, for example, oxidation, film formation, vapor deposition, doping, planarization, etching, resist removal, dicing, bonding, and packaging steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-246589, filed Sep. 25, 2008, which is hereby incorporated by reference herein in its entirety.

What is claimed is:

1. A stage apparatus, comprising:
   a plurality of stages movable across a plurality of areas,
   a plurality of lines including pipe or wiring lines configured to be connected to each of the plurality of stages,
   a plurality of movable bodies which are provided in one-to-one correspondence with the plurality of stages and are movable across the plurality of areas holding the lines connected to the plurality of stages,
   a driving unit which drives the plurality of movable bodies, and
   a controller which controls the driving by the driving unit,
   wherein the controller controls the driving unit with the movable body moving in synch with movement of the stage during inter-area movement in which the stage moves across two of the plurality of areas, and stops the driving of the movable body by the driving unit or controls the driving unit with the movable body remaining at a specific target position during intra-area movement in which a process is performed on the stage while the stage moves within one of the plurality of areas.

2. The apparatus according to claim 1, wherein the controller controls the driving unit with the movable body remaining at the specific target position during the intra-area movement, and a control response in controlling the driving unit during the intra-area movement is lower than a control response in controlling the driving unit during the inter-area movement.

3. The apparatus according to claim 1, wherein the controller controls the driving unit with the movable body remaining at the specific target position during the intra-area movement, and a control response of the controller in controlling the driving unit is lower than a control response in controlling a driving unit which drives the stage.

4. An exposure apparatus including a stage apparatus, the stage apparatus comprising:
   a plurality of stages configured to be movable across a plurality of areas,
   a plurality of lines including pipe or wiring lines configured to be connected to each of the plurality of stages,
   a plurality of movable bodies which are provided in one-to-one correspondence with the plurality of stages and are configured to be movable across the plurality of areas,
   a driving unit configured to drive the plurality of movable bodies, and
   a controller configured to control the driving by the driving unit,
   wherein the controller controls the driving unit with the movable body moving in synch with movement of the stage during inter-area movement in which the stage moves across two of the plurality of areas, and stops the driving of the movable body by the driving unit or controls the driving unit with the movable body remaining at a specific target position during intra-area movement in which a process is performed on the stage while the stage moves within one of the plurality of areas.

5. A method of manufacturing a device, the method comprising:

exposing a substrate to light using an exposure apparatus including a stage apparatus;

developing the exposed substrate; and processing the developed substrate to manufacture the device, wherein the stage apparatus comprises:

a plurality of stages configured to be movable across a plurality of areas, a plurality of lines including pipe or wiring lines configured to be connected to each of the plurality of stages, a plurality of movable bodies which are provided in one-to-one correspondence with the plurality of stages and are configured to be movable across the plurality of areas, a driving unit configured to drive the plurality of movable bodies, and a controller configured to control the driving by the driving unit, and wherein the controller controls the driving unit so that the movable body moves in synch with movement of the stage during inter-area movement in which the stage moves across two of the plurality of areas, and stops the driving of the movable body by the driving unit or controls the driving unit with the movable body remaining at a specific target position during intra-area movement in which a process is performed on the stage while the stage moves within one of the plurality of areas.

6. The apparatus according to claim 1, further comprising a second driving unit which drives the plurality of stages with respect to the plurality of movable bodies in the X and Y directions, wherein the controller controls the driving unit with the movable body moving in synch with movement of the stage during inter-area movement in which the stage moves across two of the plurality of areas, and stops the driving of the movable body in the X and Y directions by the driving unit or controls the driving unit with the movable body remaining at a specific target position in the X and Y directions during intra-area movement in which a process is performed on the stage while the stage moves in the X and Y directions within one of the plurality of areas.

* * * * *